United States Patent
Fukasawa et al.

(10) Patent No.: US 6,593,761 B1
(45) Date of Patent: Jul. 15, 2003

(54) TEST HANDLER FOR SEMICONDUCTOR DEVICE

(75) Inventors: Yoshihito Fukasawa, Yokohama (JP); Hisaaki Maiwa, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/199,426

(22) Filed: Nov. 25, 1998

(30) Foreign Application Priority Data

Nov. 28, 1997 (JP) .............................. 9-329300

(51) Int. Cl.$^7$ .................. G01R 31/02; G01R 31/26
(52) U.S. Cl. .................. 324/754; 324/760; 324/765
(58) Field of Search ................ 324/754, 755, 324/760, 158.1, 765

(56) References Cited

U.S. PATENT DOCUMENTS

| | | | | |
|---|---|---|---|---|
| 5,184,068 A | * | 2/1993 | Twigg et al. ............... 324/755 |
| 5,260,668 A | * | 11/1993 | Mallory et al. ............. 324/760 |
| 5,309,090 A | * | 5/1994 | Lipp ........................ 324/760 |
| 5,319,353 A | * | 6/1994 | Ohnishi et al. ............. 324/754 |
| 5,406,212 A | * | 4/1995 | Hashinaga et al. ......... 324/760 |
| 5,414,370 A | * | 5/1995 | Hashinaga et al. ......... 324/760 |
| 5,617,945 A | * | 4/1997 | Takahashi et al. ........ 198/471.1 |
| 5,650,732 A | * | 7/1997 | Sakai ....................... 324/754 |
| 5,692,556 A | * | 12/1997 | Hafner ...................... 324/760 |
| 5,742,158 A | * | 4/1998 | Itoh ........................ 324/158.1 |
| 5,772,387 A | * | 6/1998 | Nakamura et al. .......... 414/416 |
| 5,788,084 A | * | 8/1998 | Onishi et al. ............. 324/158.1 |
| 5,859,409 A | * | 1/1999 | Kim et al. .................. 324/760 |
| 5,969,537 A | * | 10/1999 | Kanno et al. .............. 324/760 |
| 5,977,785 A | * | 11/1999 | Burward-Hoy ............. 324/760 |
| 6,075,216 A | * | 6/2000 | Nakamura et al. .......... 209/573 |
| 6,111,421 A | * | 8/2000 | Takahashi et al. .......... 324/758 |
| 6,313,653 B1 | * | 11/2001 | Takahashi et al. .......... 324/760 |
| 6,313,654 B1 | * | 11/2001 | Nansai et al. ............. 324/760 |

FOREIGN PATENT DOCUMENTS

| | | |
|---|---|---|
| JP | 59-37751 | 3/1984 |
| JP | 5-36784 | 2/1993 |
| JP | 6-258385 | 9/1994 |
| JP | 7-294596 | 11/1995 |

* cited by examiner

Primary Examiner—Kamand Cuneo
Assistant Examiner—Jermele Hollington
(74) Attorney, Agent, or Firm—Finnegan, Henderson, Farabow, Garrett & Dunner, L.L.P.

(57) ABSTRACT

A test handler for a semiconductor device has a test socket for holding a semiconductor device sealed in a package, a temperature sensor for detecting the surface temperature of the package, a temperature controller for performing temperature control of the semiconductor device to set the temperature of the package detected by the temperature sensor at a predetermined temperature, and an electric characteristics measurer for applying a predetermined potential to the semiconductor device to measure electric characteristics.

7 Claims, 9 Drawing Sheets

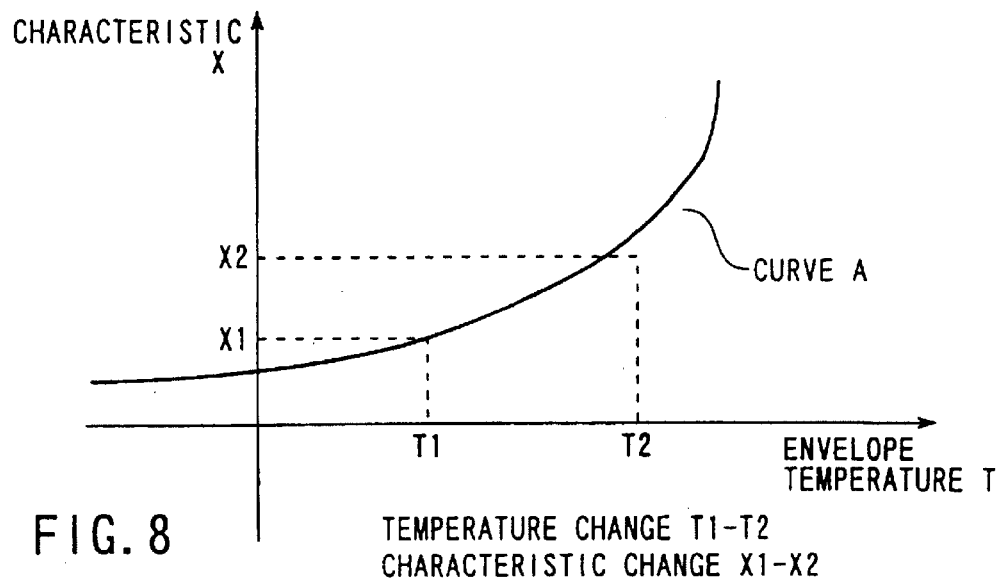
FIG. 8  TEMPERATURE CHANGE T1-T2
CHARACTERISTIC CHANGE X1-X2
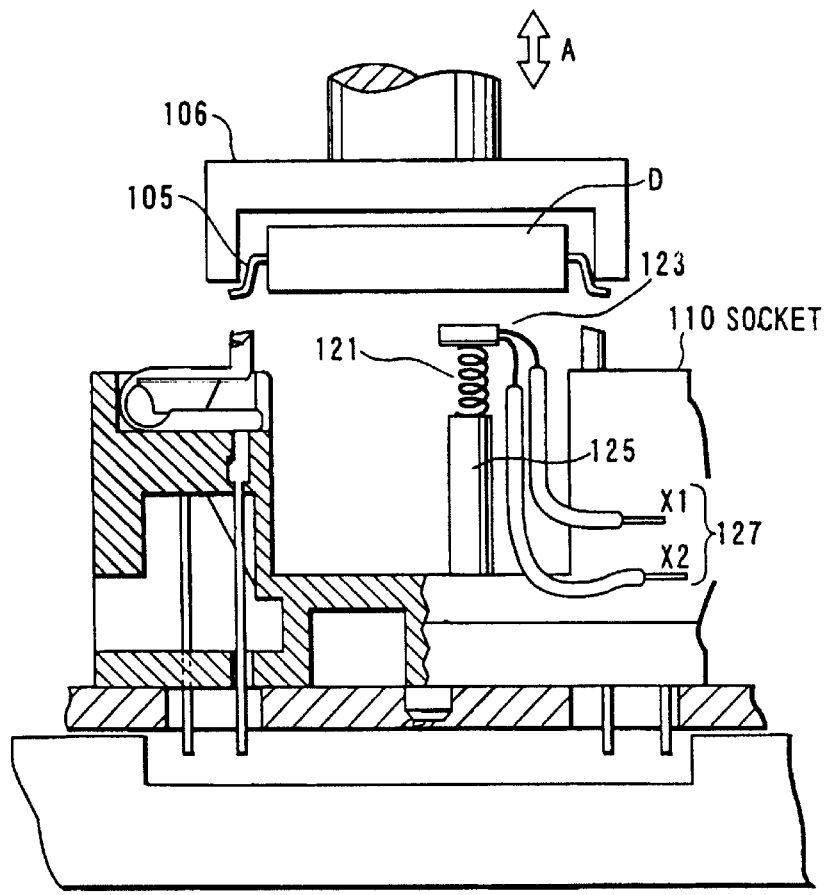
FIG. 11

TEST HANDLER FOR SEMICONDUCTOR DEVICE

BACKGROUND OF THE INVENTION

The present invention relates to a handler for measuring the electric characteristics of a semiconductor device and, more particularly, to control of an package temperature of a semiconductor device having a semiconductor chip generating a large amount of heat, and to control of a test environment.

In a recent semiconductor technique, a test handler for continuously measuring the characteristics of a large number of semiconductor devices is used.

In this test handler, the package temperature of a semiconductor device transits changes as described follows according to a procedure for measuring electric characteristics, as shown in FIG. 3.

First, depending on conditions of "magnitude of passing current", "level of applied voltage", and "length of application time" in Test 1, a set temperature increases with progress of time.

Second, the set temperature increases with progress of time depending on the conditions in Test 2.

Third, the set temperature decreases with progress of time depending on the conditions in Test 3.

Fourth, upon completion of excitation, the set temperature decreases to the temperature of a temperature chamber.

Fifth, when a semiconductor device is removed from the temperature chamber, the set temperature decreases to a room temperature.

In this graph, the description is made on the assumption that the factors which increase package temperatures depending on the conditions in Tests 1, 2, and 3 satisfy the condition of Test 3<Test 1<Test 2.

For example, in a prior art in which an atmospheric temperature in the temperature chamber is controlled under the condition of 85° C.±3° C., it is considered that a change in temperature (temperature difference ΔTC1) shown in FIG. 3 occurs because a change in package temperature does not immediately cause a change in atmospheric temperature in the temperature chamber and because the function of a temperature control system for detecting the atmospheric temperature in the temperature chamber does not instantaneously respond to the change in package temperature.

In addition, FIG. 2 shows the package temperature of a semiconductor device when the electric characteristics are measured by the test handler of the prior art.

The package temperature of the semiconductor device changes as follows according to the procedure of measuring the electric characteristics.

First, after the package temperature increases to a set temperature obtained by heating in the temperature chamber, a measurement of electric characteristics is started.

Second, the electric characteristics are measured while conditions are sequentially changed to the conditions in Test 1, Test 2, and Test 3.

Third, since a self calorific value of a semiconductor device due to excitation is very small, the envelope temperature slightly changes.

Fourth, upon completion of excitation, the semiconductor device is conveyed out of the temperature chamber, and the package temperature decreases to a room temperature.

FIG. 8 shows typical characteristics of a semiconductor device. It is generally known that a characteristic X changes (from X1 to X2) as indicated by a quadratic curve A with a change in envelope temperature (from T1 to T2).

In the handler according to the prior art, the following problems are posed because the package temperature of a semiconductor device considerably changes.

First, the electric characteristic value of semiconductor device changes with a temperature by an increase in temperature caused by excitation.

Second, the degree of an increase in temperature changes depending on the magnitude of a passing current or the level of an applied voltage, and the electric characteristic value of the semiconductor device changes.

Third, the degree of an increase in temperature changes depending on the length of excitation time, and the electric characteristic value of the semiconductor device changes.

Fourth, when a plurality of electric characteristics are measured in series with each other according to a program, the degree of an increase in temperature (for example, ΔTC1 in FIG. 3) changes depending on a combination of the magnitude of a passing current and the length of excitation time (for example, Test 1, Test 2, and Test 3 in FIG. 3), and the electric characteristic value of the semiconductor device changes.

Fifth, in a state wherein the temperature of the semiconductor device continuously changes because of the above factors which change the characteristic values, as indicated by a characteristic X in FIG. 8, the electric characteristic value is not easily specified.

Since the above problems are posed, in a test handler for a semiconductor device having a large amount of heat generation, the electric characteristic value is not easily specified because of a change in electric characteristic caused by the change in temperature of the semiconductor device in the prior art in which "the atmospheric temperature in the temperature chamber is detected to control the temperature in the temperature chamber". For this reason, the test handler of the prior art cannot be used.

More specifically, since the temperature of the semiconductor device is measured by the atmospheric temperature in the temperature chamber, the measurement cannot quickly respond to the change in temperature of the semiconductor device itself. For this reason, it is difficult to precisely specify an electric characteristic value depending on the present temperature.

BRIEF SUMMARY OF THE INVENTION

It is an object of the present invention to measure a surface temperature of a semiconductor device to realize precise measurement of electric characteristics depending on the surface temperature.

According to the present invention, there is provided a test handler for a semiconductor device comprising: a temperature chamber for storing a semiconductor device sealed in a package; detection means, arranged in the temperature chamber, for detecting a surface temperature of the package of the semiconductor device; temperature control means for performing temperature control of the temperature chamber to set the temperature of the package detected by the detection means at a predetermined temperature; and measurement means for applying a predetermined potential to the semiconductor device to measure electric characteristics.

According to the present invention, with the above arrangement, since the temperature of a semiconductor device is conventionally measured by only the atmospheric temperature of the temperature chamber, a precise electric characteristic value depending on the present temperature cannot be easily specified. According to the present invention, since the surface temperature of the device is directly measured, electric characteristics can be very precisely measured.

According to the present invention, there is provided a test handler for a semiconductor device comprising: a temperature chamber for storing a semiconductor device sealed in a package; holding means, arranged in the temperature chamber, for holding the semiconductor device; pressing means for pressing a temperature sensor onto a surface of the package of the temperature chamber held by the holding means by using a spring; detection means for detecting a surface temperature of the package of the semiconductor device by the temperature sensor pressed onto the surface of the package; temperature control means for performing temperature control of the temperature chamber to set the temperature of the package detected by the detection means at a predetermined temperature; and measurement means for applying a predetermined potential to the semiconductor device to measure electric characteristics when the temperature of the package becomes the predetermined temperature.

According to the present invention, when the temperature sensor is pressed onto the semiconductor device by using the spring, a more precise surface temperature can be measured, and precise measurement of the electric characteristics based on reliable temperature measurement can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a graph showing characteristics of a semiconductor device;

FIG. 11 shows a temperature detection device showing a temperature detection of a semiconductor device according to the third embodiment;

DETAILED DESCRIPTION OF THE INVENTION

Embodiments of the present invention will be described below with reference to the accompanying drawings.

First, the first embodiment will be described below.

Figure 1:
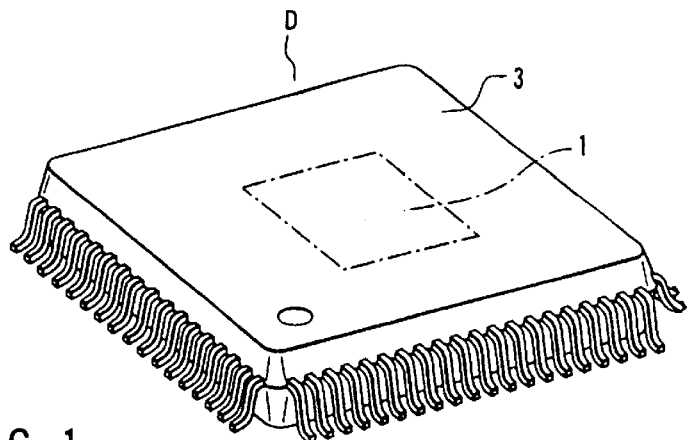
FIG. 1 is a schematic view showing the appearance of a semiconductor device according to the present invention.
Figure 2:
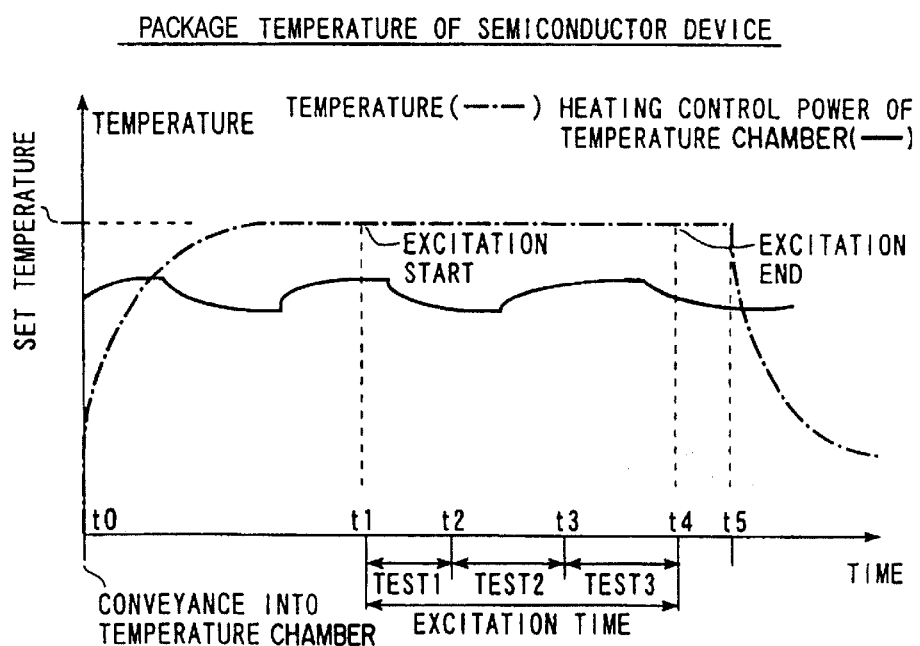
FIG. 2 is a graph showing the temperature of an package of a semiconductor device to indicate the temperature characteristics of prior art semiconducting testing.
Figure 3:
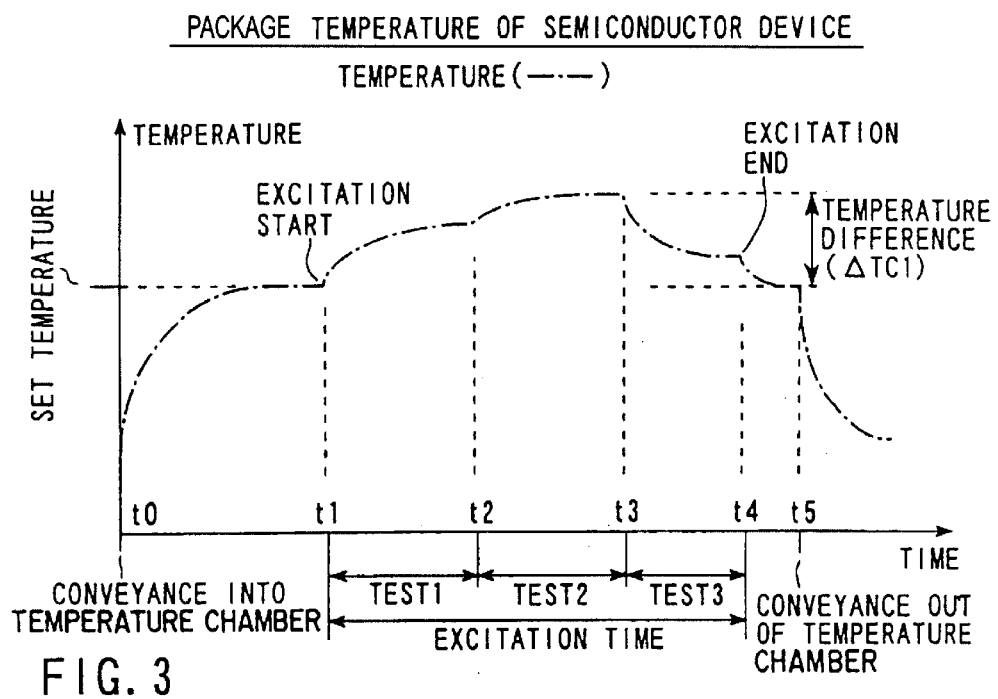
FIG. 3 is a graph showing the package temperature of a semiconductor device to explain problems of the prior art.

FIG. 1 illustrates a semiconductor device D that includes a semiconductor element 1 sealed within a package 3.

Figure 4:
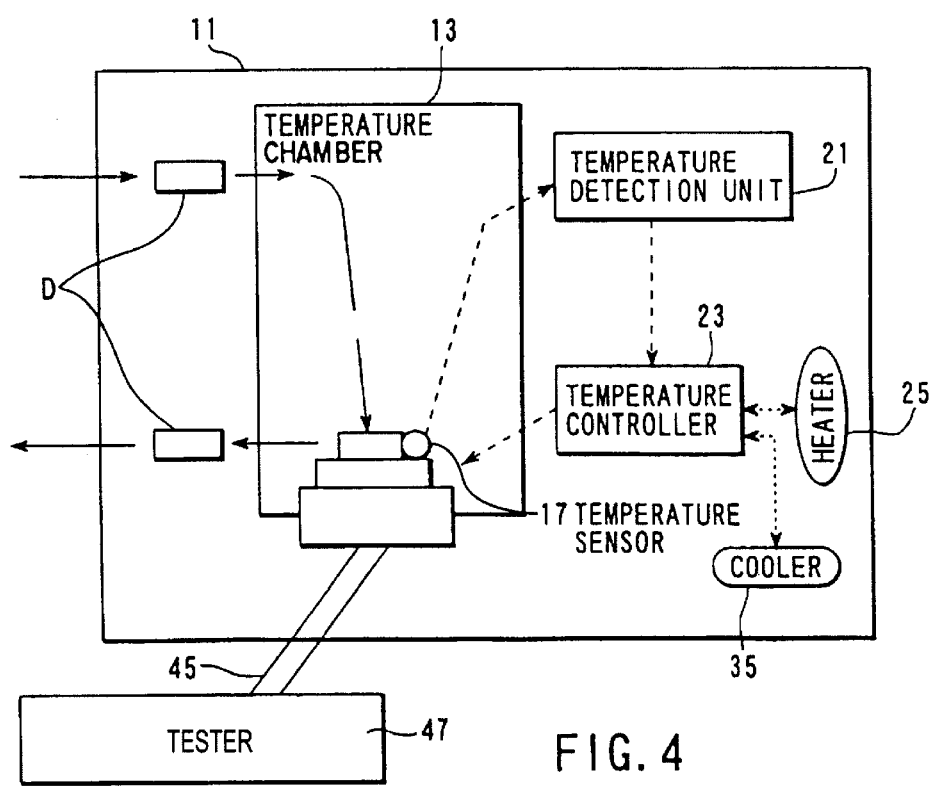
FIG. 4 is a view showing the arrangement of a test handler according to the first embodiment.
Figure 14:
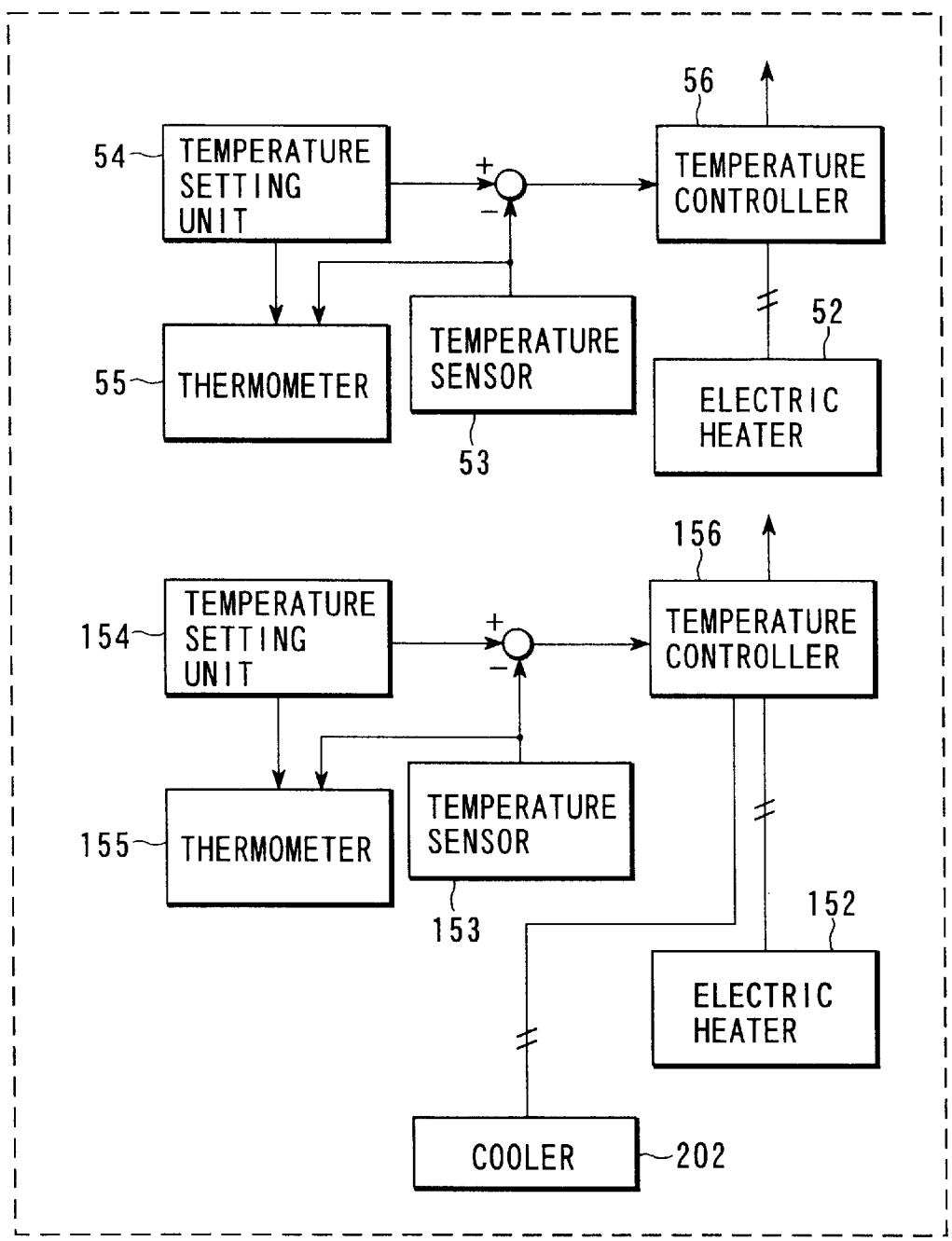
FIG. 14 is temperature control block diagram related to first and second temperature chambers of the first and second embodiments.

FIG. 4 is a view for explaining a handler 11 according to the first embodiment. Referring to FIG. 4, a temperature sensor 17 for detecting the temperature of the surface of a semiconductor device D and a cooler 35 for controlling the temperature are further arranged. In addition, FIG. 14 shows temperature control blocks related to first and second temperature chambers according to the first and second embodiments. In the temperature control block of the first temperature chamber serving as a pre-heat chamber, a temperature measurement unit 54 is connected to a thermometer 55, a temperature sensor 53, and a temperature controller 56 as shown in FIG. 14. In the temperature control block of the second temperature chamber serving as a temperature-measurement chamber, a temperature measurement unit 154 is connected to a thermometer 155, a temperature sensor 153, and a temperature control 156 as shown in FIG. 14. Furthermore; an electric heater 152 and a cooler 202 are controlled by the temperature controller.

Referring again to FIG. 4, a tester 47 is coupled to the device D by wiring 45. Tester 47 includes circuitry for applying a predetermined potential to device D via wiring 45 to measure electrical characteristics, via wiring 45. The circuitry of tester 47 is also responsive to the temperature detection unit 21 to apply the predetermined potential when the device D reaches a predetermined temperature.

In this arrangement, especially, the typical arrangement of the present invention will be mainly described below.

First, although a temperature detection unit 21 detects the atmospheric temperature of a temperature chamber in the prior art, the package temperature of the semiconductor device in the temperature chamber is detected in the arrangement in FIG. 4.

Second, in the arrangement in FIG. 4 of the present invention, a queue for heating a semiconductor device in a temperature chamber to increase the temperature of the semiconductor device to a set temperature need not be arranged.

With the above characteristic feature, according to the first embodiment, the temperature of the surface of a semiconductor device D is accurately detected, and temperature control is performed according to this temperature. In this manner, precise temperature control which cannot be obtained by the above conventional temperature detection of the temperature chamber can be realized, and precise electric characteristics can be obtained on the basis of the controlled temperature.

Figure 6:
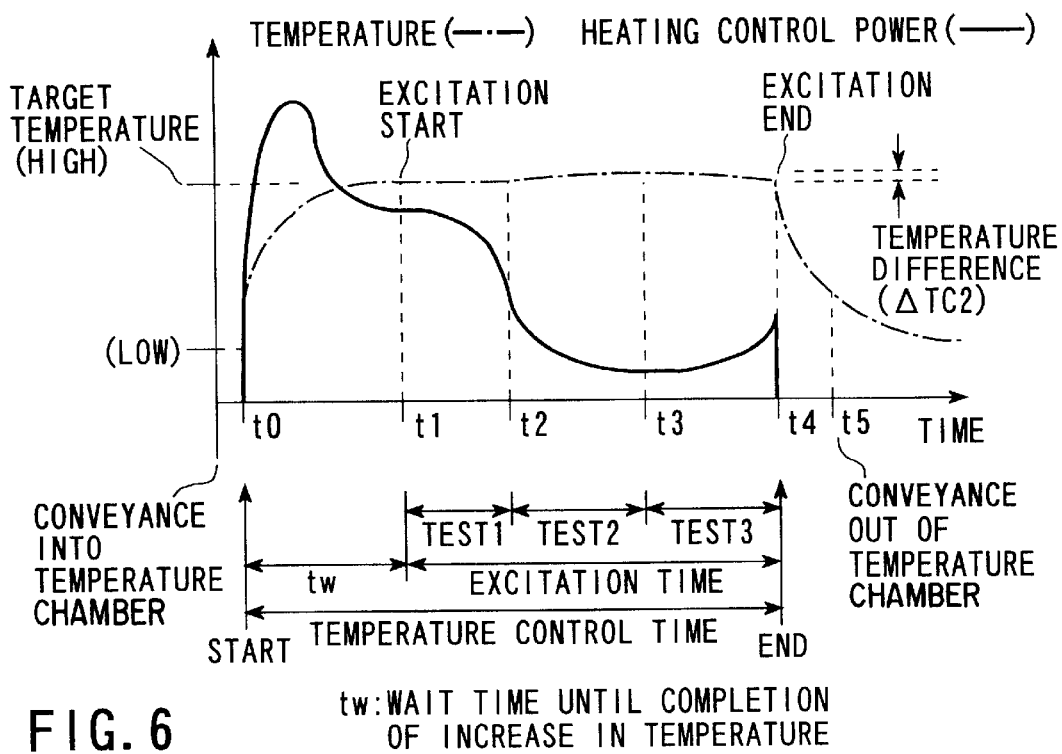
FIG. 6 is a graph showing an package temperature and temperature control in the first embodiment.

As FIG. 6 is a view for explaining an package temperature of the semiconductor device D and temperature control in the first embodiment.

Figure 9:
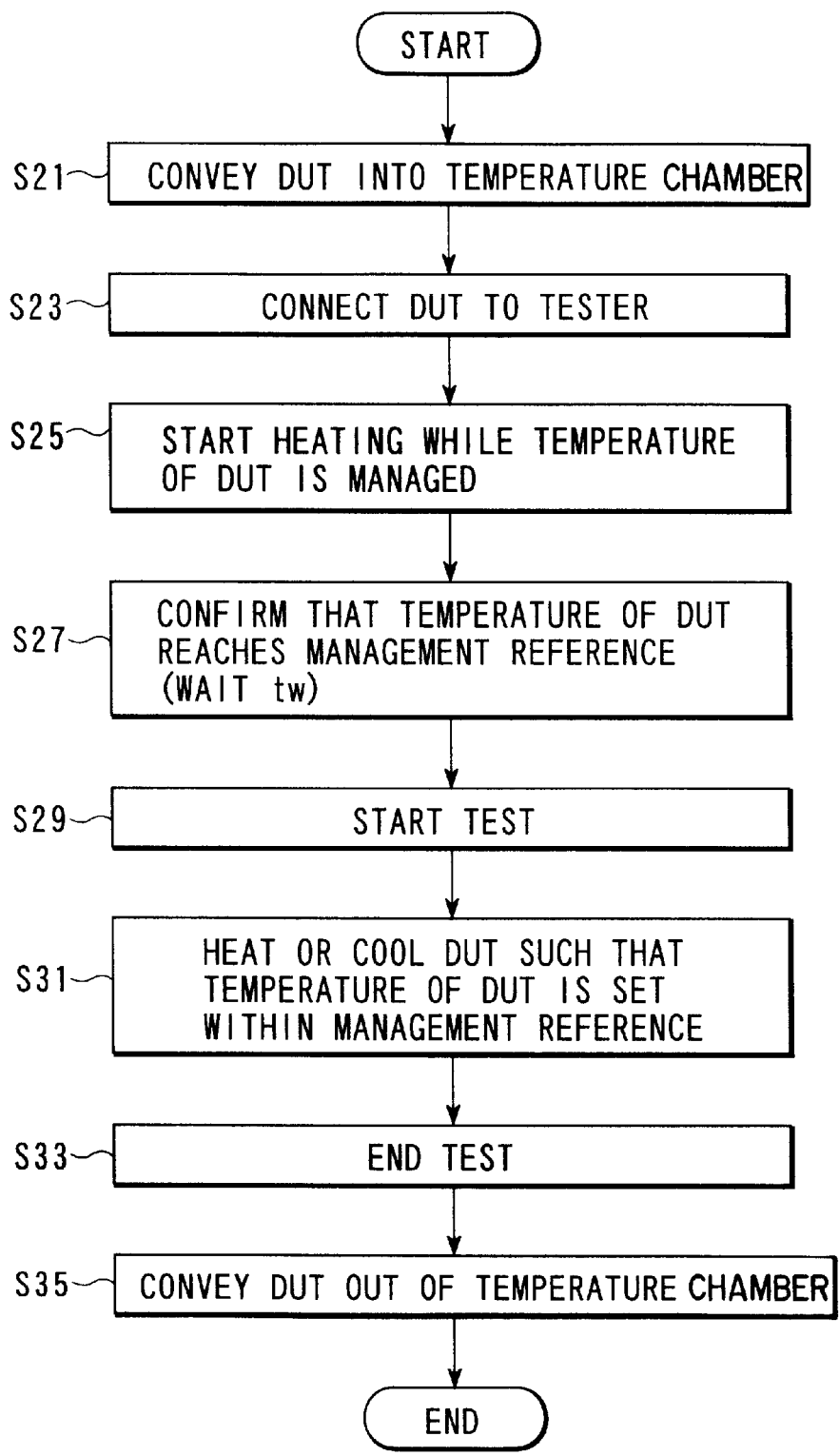
FIG. 9 is a flow chart of a device unit test in the first embodiment.

The electric characteristics of the semiconductor device in this embodiment are measured by the following sequence, as shown in the flow chart in FIG. 9.

A semiconductor device is conveyed into the temperature chamber (S21). The semiconductor device is connected to the tester (S23). The semiconductor device is heated until the package temperature of the semiconductor device conveyed into the temperature chamber reaches a target temperature (S25). After a period of wait time (tw) has elapsed, it is confirmed that the package temperature reaches the target temperature (S27).

Upon completion of confirmation, the semiconductor device is electrified under conditions in Test 1 (S29).

A change in package temperature caused by excitation is detected, and power for heating the semiconductor device is controlled (decreased) (S31). The semiconductor device is electrified under conditions in Test 2. The change in temperature is detected to control (decrease) the power for heating the semiconductor device.

The semiconductor device is electrified under conditions in Test 3. A change in temperature is detected to control (increase) the heating power.

Electrification is finished, and the heating power is turned off (S33).

Finally, the semiconductor device is conveyed out of the temperature chamber (S35).

In this embodiment, by using the heat control method as described above, the controlled power is changed as indicated by a quadratic curve denoted by a heavy line in FIG. 6, so that the package temperature can be set within a temperature difference (ΔTC2) reduced by the prior art.

In this manner, the electric characteristics of the semiconductor device can be specified (defined) as characteristics obtained when the package temperature falls within the range of the temperature difference ΔTC2.

The second embodiment will be described next with reference to the accompanying drawings.

Figure 5:
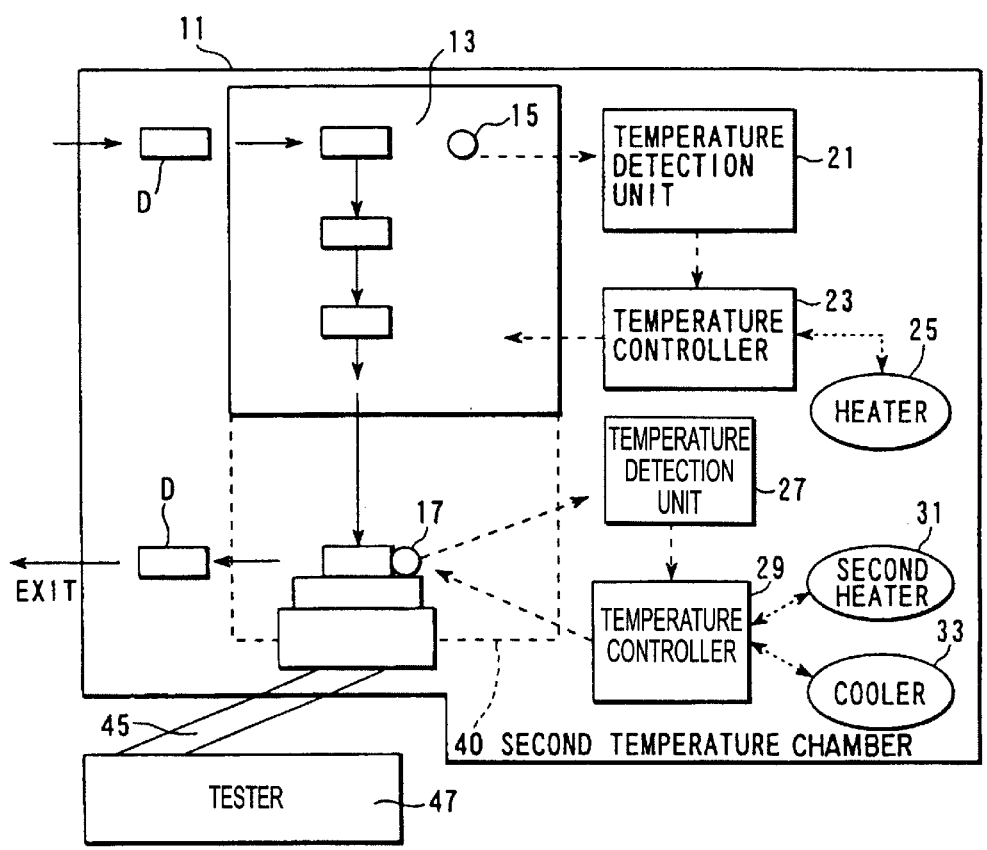
FIG. 5 is a view showing the arrangement of a test handler according to the second embodiment.

FIG. 5 is a view showing the arrangement of a handler according to the second embodiment. Referring to FIG. 5, a second temperature chamber 40 is especially arranged, and a temperature sensor 17 for detecting the surface temperature of a semiconductor device D is arranged in the second temperature chamber 40. In addition, in order to control the temperature of the second temperature chamber 40, a second temperature detection unit 27; a second temperature controller 29 connected thereto; and a heater 31 and a cooler 33 which are connected to the second temperature detection unit 27 and the second temperature controller 29 are further arranged.

As explained above, FIG. 14 shows a temperature control block according to the first and second embodiments.

The differences between the arrangement of the second embodiment and the arrangement of the first embodiment shown in FIG. 4 will be described below.

First, although one temperature chamber is arranged in the first embodiment, two temperature chambers 13 and 40 are arranged in the second embodiment.

Figure 13:
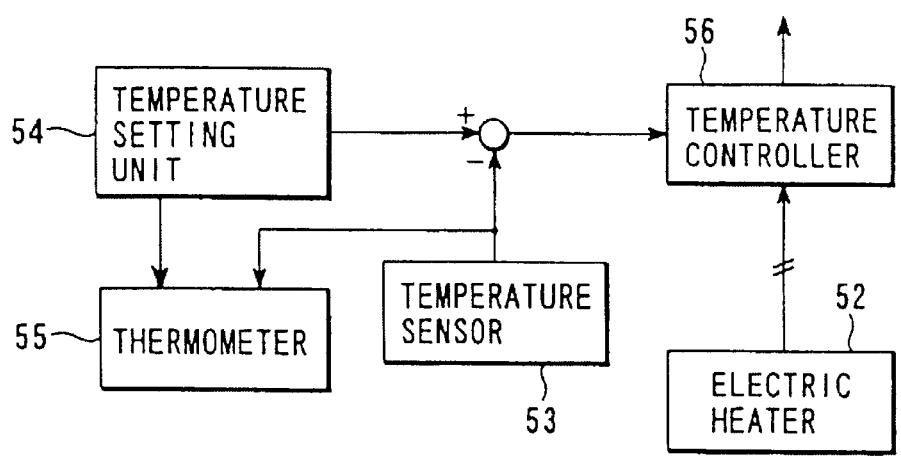
FIG. 13 is a temperature control block diagram related to a first temperature chamber of the second embodiment.

Second, the first temperature chamber 13 uses a technique, including a temperature sensor 15 connected to the temperature detection unit 21, for detecting the atmospheric temperature of the temperature chamber to perform temperature control. FIG. 13 is a temperature control block diagram related to the first temperature chamber according to the second embodiment.

Third, the second temperature chamber 40 uses a technique for detecting an package temperature as in the first embodiment to perform temperature control.

With the above characteristic features according to the second embodiment, the temperature of the semiconductor device D is made to be considerably close to a target temperature in the first temperature chamber, and characteristic detection with reliable temperature control can be performed by the temperature sensor being in contact with the semiconductor device D in the second temperature chamber.

Figure 7:
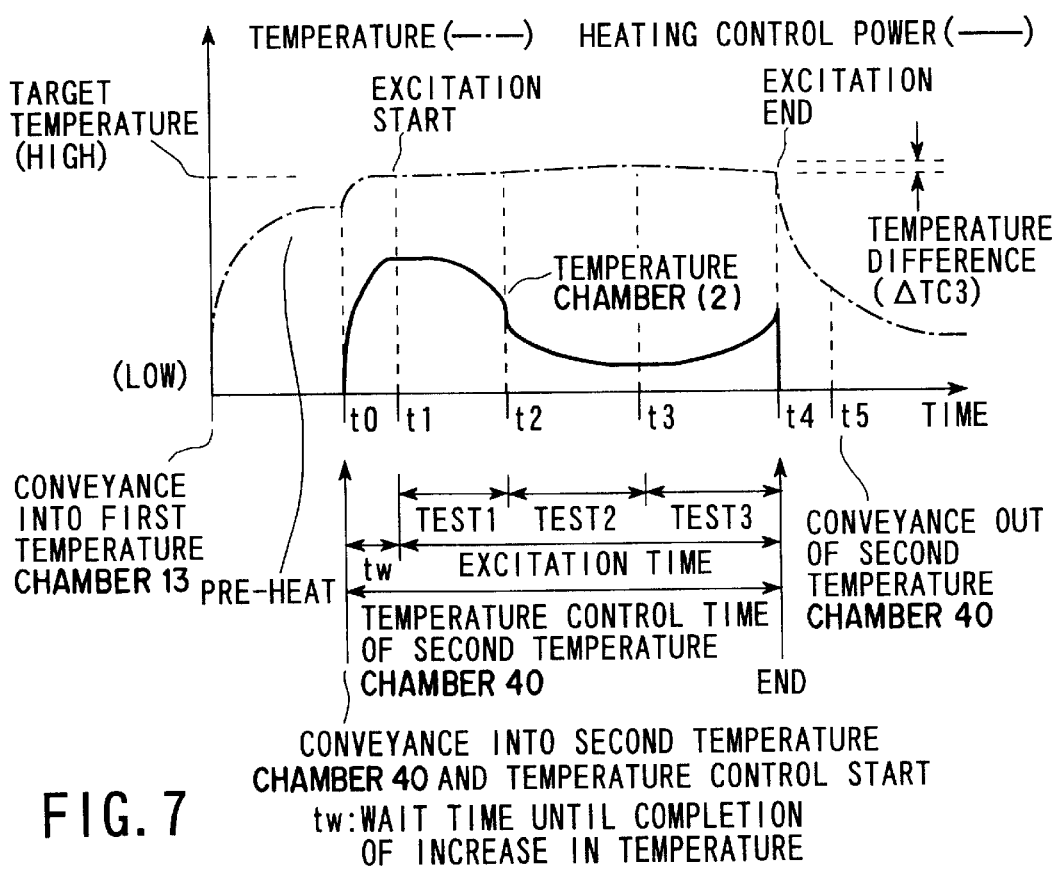
FIG. 7 is a graph showing an package temperature and temperature control in the second embodiment.
Figure 10:
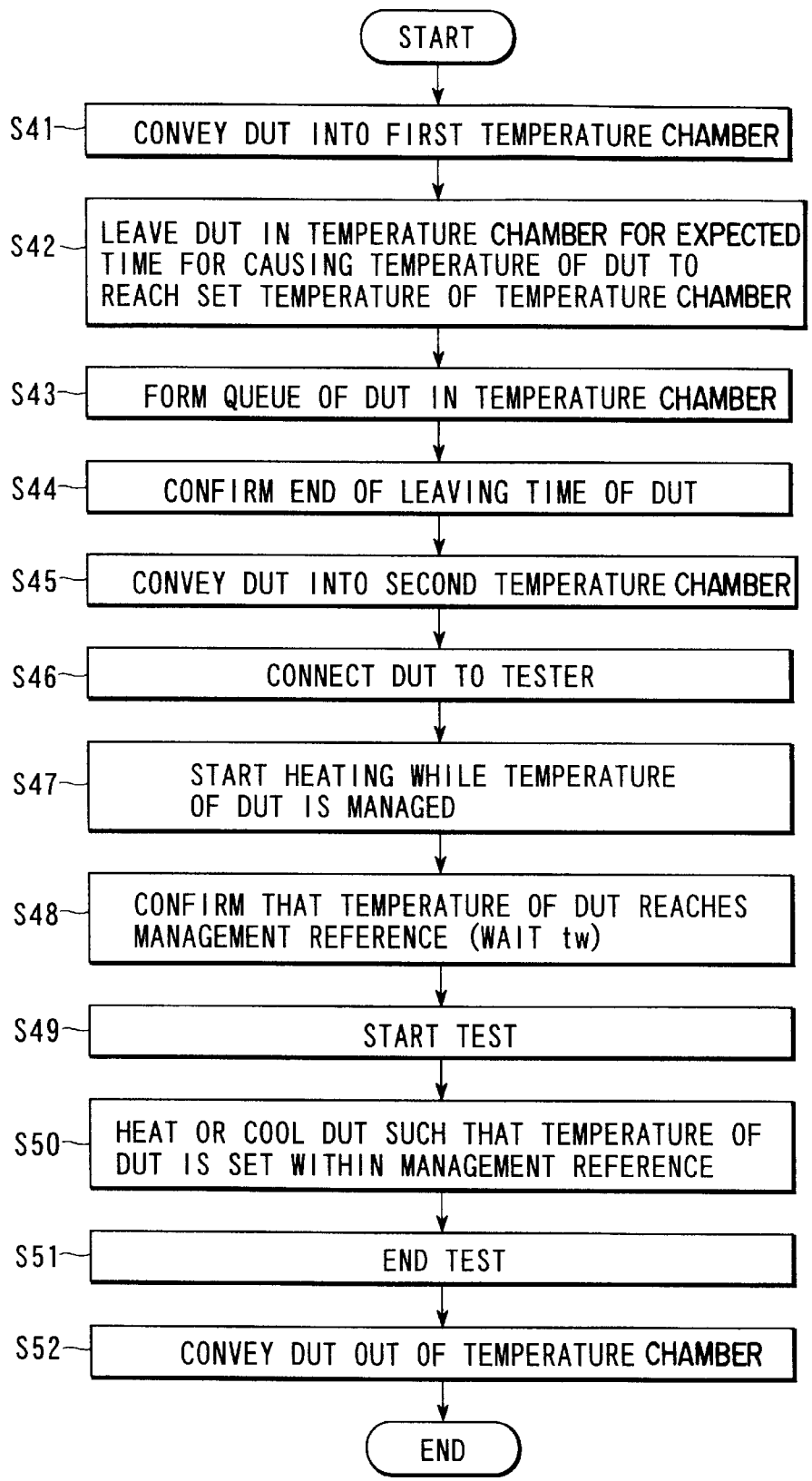
FIG. 10 is a flow chart of a device unit test in the second embodiment.

A measurement procedure according to the second embodiment will be described below. FIG. 7 is a view for explaining an package temperature of the semiconductor device and temperature control in the second embodiment. The electric characteristics of the semiconductor device in this embodiment are measured by the following sequence, as shown in FIG. 10.

The semiconductor device is conveyed into the first temperature chamber (S41).

The semiconductor device is pre-heated until the package temperature of the semiconductor device conveyed into the first temperature chamber reaches a temperature slightly lower than a target temperature. More specifically, the semiconductor device is left in the first temperature chamber for a time expected to result in the temperature reaching a set temperature of the temperature chamber (S42), a queue of the semiconductor devices D is formed in the temperature chamber (S43). The leaving time of the semiconductor device is confirmed (S44).

In addition, the semiconductor device is conveyed into the second temperature chamber to be heated until the temperature of the semiconductor device reaches the target temperature (S45). More specifically, the semiconductor device is conveyed into the second temperature chamber, the semiconductor device is connected to the tester (S46), and heating is started while the temperature of the semiconductor device is managed (S47).

If it is confirmed that the semiconductor device reaches a management reference (S48), the electric characteristics are measured by the same sequence as that in the above description of the first embodiment (S49, S50).

Upon completion of the test of the semiconductor device, finally, the semiconductor device is conveyed out of the temperature chamber (S52).

The difference between the functions of the second and first embodiments will be described below with reference to FIG. 6 and FIG. 7.

More specifically, according to the second embodiment, since the pre-heat function of the first temperature chamber and the queue for the semiconductor device are prepared, a characteristic feature in which a period of wait time (tw) is reduced, makes it possible to obtain a throughput higher than that of the first embodiment.

Furthermore, the second embodiment can have a characteristic feature in which heat control power of the second temperature chamber can be reduced by the pre-heat function of the first temperature chamber as indicated by a quadratic curve denoted by a heavy line in FIG. 7.

Figure 12:
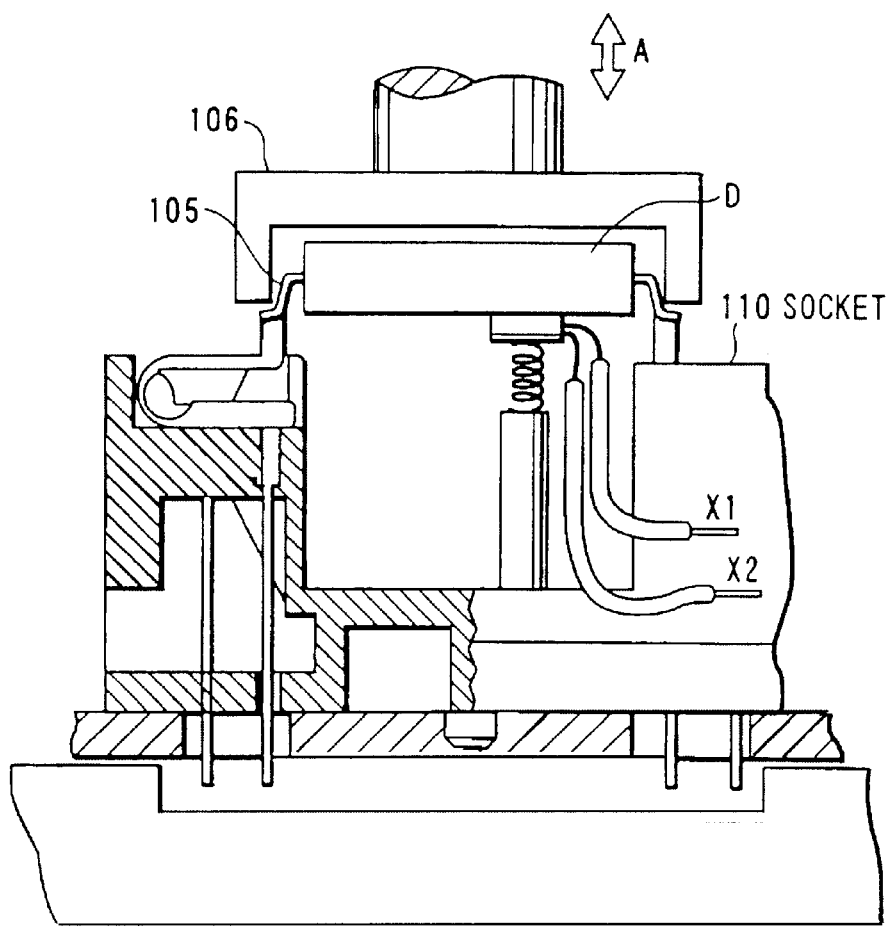
FIG. 12 shows a temperature detection device showing a temperature detection of the semiconductor device according to the third embodiment.

The third embodiment will be described next FIG. 11 and FIG. 12 are views showing a temperature detection device to illustrate temperature detection of a semiconductor device D according to the third embodiment. Referring to these drawings, a semiconductor device D having a lead line 105 is held by a holder 106. In addition, a temperature sensor 123 is connected to a support 125 through a spring 121. A signal leader 127 is connected to the temperature sensor 123. With this arrangement, when the holder 106 moves in a vertical direction indicated by an arrow A, as shown in FIG. 12, the temperature sensor 123 is brought into tight contact with the semiconductor device D. As a result, the surface temperature of the semiconductor device D can be more precisely detected. In this manner, according to the third embodiment, precise measurement of electric characteristics based on reliable temperature control can be realized.

The characteristic feature of the third embodiment is also connected with the first and second embodiments described above. When these embodiments are simultaneously executed, more reliable measurement of electric characteristics can be realized.

As described above, according to the present invention, when control of a temperature environment for measuring the electric characteristics of a semiconductor device in the test handler is changed from a method of controlling the atmospheric temperature of a temperature chamber to a method of controlling the package temperature of a semiconductor device, the following effects can be obtained.

First, when the package temperature of a semiconductor device is controlled within a set range, the electric characteristics of the semiconductor device can be specified (defined) with reference to the envelope temperature. Second, quality standards of the semiconductor device can be determined by the definition of the electric characteristics. Third, quality assurance based on the quality standards of the semiconductor device can be achieved. Fourth, use conditions of the semiconductor device (heat-radiation design, housing design, and the like) can be recommended to a user. Fifth, by detecting the package temperature of the semiconductor device, a counter-measure against an accident caused by thermorunaway of the semiconductor device which occurs during measurement of electric characteristics can be early performed.

Embodiments of the present invention have been described in which the temperature of the device under test is monitored and controlled during electrical testing. Optionally, the testing process can be further controlled to stop application of a predetermined potential to the device under test, to stop measurement of the electrical characteristics thereof, when the temperature of the semiconductor package exceeds a predetermined temperature. For example, the circuitry of tester 47 can be configured to provide such control.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A test handler for a semiconductor device comprising:
   a temperature chamber for containing the semiconductor device sealed in a package;
   a detector in direct contact with a surface of the package, arranged in the temperature chamber, for detecting a surface temperature of the package of the semiconductor device directly;
   a temperature controller for performing temperature control of the temperature chamber to set the temperature of the package detected by the detector at a first predetermined temperature; and
   measurement means for applying a predetermined potential to the semiconductor device to measure electric characteristics.

2. A test handler for a semiconductor device according to claim 1, wherein the temperature control means includes means for increasing the temperature of the package and means for decreasing the temperature of the package.

3. A test handler for a semiconductor device according to claim 1, wherein the measurement means includes:
   reaching detection means for detecting that the semiconductor device reaches the first predetermined temperature; and
   wherein the measurement means applies the predetermined potential to the semiconductor device to measure electric characteristics when the reaching detection means detects that the semiconductor device reaches the first predetermined temperature.

4. A test handler for a semiconductor device according to claim 1, wherein the measurement means includes:
   stop means for stopping application of the predetermined potential to stop measurement of the electric characteristics when the temperature of the package of the semiconductor device exceeds a second predetermined temperature.

5. A test handler for a semiconductor device comprising:
   a first temperature chamber through which a semiconductor device sealed in a package passes;
   a first temperature sensor, arranged in the first temperature chamber, for measuring a temperature in the first temperature chamber;
   a first temperature controller for controlling a temperature of the first temperature chamber depending on the temperature measured by the first temperature sensor;
   a second temperature chamber into which the semiconductor device is conveyed from the first temperature chamber and in which the semiconductor device is contained;
   a detector, arranged in the second temperature chamber, for detecting a surface temperature of the package of the semiconductor device directly;
   a second temperature controller for performing temperature control of the second temperature chamber to set the temperature of the package detected by the detector at a predetermined temperature; and
   measurement means for applying a predetermined potential to the semiconductor device to measure electric characteristics when the temperature of the package becomes the predetermined temperature.

6. A test handler for a semiconductor device comprising:
   a temperature chamber for containing a semiconductor device sealed in a package;
   a detector in direct contact with a surface of the package, arranged in the temperature chamber, for detecting a surface temperature of the package of the semiconductor device;
   a heater for increasing a temperature of the temperature chamber by using a temperature controller to set the temperature of the package detected by the detector at a predetermined temperature;
   a cooler for decreasing the temperature of the temperature chamber by using a temperature controller to set the temperature of the package detected by the detector at the predetermined temperature; and measurement means for applying a predetermined potential to the semiconductor device to measure electric characteristics when the temperature of the package becomes the predetermined temperature.

7. A test handler for a semiconductor device comprising:

a temperature chamber for containing a semiconductor device sealed in a package;

a holder, arranged in the temperature chamber, for holding the semiconductor device;

a temperature sensor;

a spring for pressing the temperature sensor onto a surface of the package of the temperature chamber held by the holder;

a detector for detecting a surface temperature of the package of the semiconductor device directly by the temperature sensor pressed onto the surface of the package;

a temperature controller for performing temperature control of the temperature chamber to set the temperature of the package detected by the detector at a predetermined temperature; and measurement means for applying a predetermined potential to the semiconductor device to measure electric characteristics when the temperature of the package becomes a predetermined temperature.

* * * * *